United States Patent
Liu et al.

(10) Patent No.: US 12,243,827 B1
(45) Date of Patent: Mar. 4, 2025

(54) INDEPENDENT POWER CONTROL FOR INTEGRATED CIRCUIT (IC) CHIPS

(71) Applicant: Auradine, Inc., Santa Clara, CA (US)

(72) Inventors: Guangbin Liu, Santa Clara, CA (US); Leon Zhou, Santa Clara, CA (US); Barun Kar, Santa Clara, CA (US)

(73) Assignee: Auradine Inc., Santa Clara, CA (US)

( * ) Notice: Subject to any disclaimer, the term of this patent is extended or adjusted under 35 U.S.C. 154(b) by 0 days.

(21) Appl. No.: 18/959,909

(22) Filed: Nov. 26, 2024

(51) Int. Cl.
*H02M 3/00* (2006.01)
*G06F 1/26* (2006.01)
*H01L 23/34* (2006.01)
*H01L 23/538* (2006.01)
*H01L 25/10* (2006.01)

(52) U.S. Cl.
CPC ............ *H01L 23/5386* (2013.01); *G06F 1/26* (2013.01); *H01L 23/34* (2013.01); *H01L 25/105* (2013.01); *H02M 3/00* (2013.01)

(58) Field of Classification Search
None
See application file for complete search history.

(56) References Cited

U.S. PATENT DOCUMENTS

| | | | |
|---|---|---|---|
| 8,362,642 B2 * | 1/2013 | Zerbe ..................... | G06F 1/26 307/43 |
| 11,709,536 B2 * | 7/2023 | Sadowski ............. | G06F 1/3243 713/340 |
| 11,960,339 B2 * | 4/2024 | Chapman ................. | G06F 1/28 |

* cited by examiner

*Primary Examiner* — Jeffrey S Zweizig
(74) *Attorney, Agent, or Firm* — Fish & Richardson P.C.

(57) ABSTRACT

A circuit board includes: a first plurality of integrated circuit (IC) chips, a second plurality of IC chips that is distinct from the first plurality of IC chips, a first power rail configured to provide power to the first plurality of IC chips, and a second power rail configured to provide power to the second plurality of IC chips. A controller is configured to receive sensor data from the first plurality of IC chips and the second plurality of IC chips and independently determine, based on the sensor data, a first power supply voltage for the first power rail and a second power supply voltage for the second power rail. The first power supply voltage and the second power supply voltage are different from one another. A power supply is configured to provide the first and second power supply voltages to the first and second power rails.

20 Claims, 6 Drawing Sheets

INDEPENDENT POWER CONTROL FOR INTEGRATED CIRCUIT (IC) CHIPS

FIELD OF THE DISCLOSURE

This specification generally relates to power control for multiple integrated circuit (IC) chips.

BACKGROUND

An electronic circuit can include multiple integrated circuit (IC) chips. Each of the IC chips can generate signals indicative of computations performed by the IC chips. The IC chips can receive voltage from a power rail to power the computations.

SUMMARY

Some aspects of this disclosure relate to a circuit system. The circuit system includes a circuit board including: a first plurality of integrated circuit (IC) chips, a second plurality of IC chips that is distinct from the first plurality of IC chips, a first power rail configured to provide power to the first plurality of IC chips, and a second power rail configured to provide power to the second plurality of IC chips. The circuit system includes a controller configured to receive sensor data from the first plurality of IC chips and the second plurality of IC chips and independently determine, based on the sensor data, a first power supply voltage for the first power rail and a second power supply voltage for the second power rail. The first power supply voltage and the second power supply voltage are different from one another. The circuit system includes a power supply configured to provide the first power supply voltage to the first power rail and the second power supply voltage to the second power rail.

This and other circuit systems described herein can have one or more of at least the following characteristics.

In some implementations, the first plurality of IC chips include first temperature sensors configured to output temperature data for the first plurality of IC chips, and the second plurality of IC chips include second temperature sensors configured to output temperature data for the second plurality of IC chips. The controller is configured to determine the first power supply voltage and the second power supply voltage respectively based on the temperature data for the first plurality of IC chips and the second plurality of IC chips.

In some implementations, the controller is configured to determine the first power supply voltage and the second power supply voltage subject to a target temperature range of at least one of the first plurality of IC chips or the second plurality of IC chips.

In some implementations, the controller is configured to determine the first power supply voltage subject to a first target IC chip temperature range for the first plurality of IC chips and to determine the second power supply voltage subject to a second target IC chip temperature range for the second plurality of IC chips. The first target IC chip temperature range is different from the second target IC chip temperature range.

In some implementations, the controller is configured to execute a first software thread to determine the first power supply voltage and to execute a second software thread to determine the second power supply voltage.

In some implementations, the controller is configured to determine the first power supply voltage based on at least a first clock frequency of the first plurality of IC chips and to determine the second power supply voltage based on at least a second clock frequency of the second plurality of IC chips. The first clock frequency is different from the second clock frequency.

In some implementations, the controller is configured to determine the first power supply voltage subject to a first target power range for the first plurality of IC chips and to determine the second power supply voltage subject to a second target power range for the second plurality of IC chips. The first target power range is different from the second target power range.

In some implementations, the controller is configured to adjust at least one first clock frequency of the first plurality of IC chips based on the first power supply voltage, and to adjust at least one second clock frequency of the second plurality of IC chips based on the second power supply voltage. The at least one first clock frequency is adjusted to be different from the at least one second clock frequency.

In some implementations, the controller is configured to: in a first phase of operation, jointly determine a common power supply voltage for both of the first power rail and the second power rail; and in a second phase of operation following the first phase of operation, independently determine the first power supply voltage and the second power supply voltage to be different from one another.

In some implementations, the controller is configured to switch from the first phase of operation to the second phase of operation based on a temperature differential between the first plurality of IC chips and the second plurality of IC chips.

In some implementations, the power supply includes at least one DC-DC regulator configured to receive commands from the controller and, based on the commands, provide the first power supply voltage and the second power supply voltage.

In some implementations, the circuit board is a first circuit board, and the circuit system includes a second circuit board. The controller is configured to receive sensor data from IC chips of the second circuit board and determine a third power supply voltage for the IC chips of the second circuit board. The third power supply voltage is determined independently from at least one of the first power supply voltage or the second power supply voltage.

In some implementations, the circuit system includes a common enclosure in which the circuit board, the controller, and the power supply are arranged.

In some implementations, the circuit board includes a third plurality of IC chips that is distinct from the first and second pluralities of IC chips, and a third power rail configured to provide power to the third plurality of IC chips. The controller is configured to determine a third power supply voltage for the third power rail. The third power supply voltage is determined independently from the first and second power supply voltages.

In some implementations, the circuit board includes a third plurality of IC chips that is distinct from the first and second pluralities of IC chips, and a third power rail configured to provide power to the third plurality of IC chips. The controller is configured to determine a third power supply voltage for the third power rail jointly with determination of the first power supply voltage, wherein the third power supply voltage is the same as the first power supply voltage.

Some aspects of this disclosure relate to a power control method. The method includes receiving sensor data from a first plurality of integrated circuit (IC) chips and a second plurality of IC chips that is distinct from the first plurality of IC chips. The first and second pluralities of IC chips are mounted on a common substrate. The first plurality of IC chips is configured to receive power from a first power rail, and the second plurality of IC chips is configured to receive power from a second power rail. The method includes independently determining, based on the sensor data, a first power supply voltage for the first power rail and a second power supply voltage for the second power rail. The first power supply voltage and the second power supply voltage are different from one another. The method includes providing the first power supply voltage to the first power rail and the second power supply voltage to the second power rail.

This and other methods described herein can have one or more of at least the following characteristics.

In some implementations, the first plurality of IC chips include first temperature sensors configured to output temperature data for the first plurality of IC chips. The second plurality of IC chips include second temperature sensors configured to output temperature data for the second plurality of IC chips. The method includes determining the first power supply voltage and the second power supply voltage based respectively on temperature data for the first plurality of IC chips and the second plurality of IC chips.

In some implementations, the method includes determining the first power supply voltage subject to a first target IC chip temperature range for the first plurality of IC chips, and determining the second power supply voltage subject to a second target IC chip temperature range for the second plurality of IC chips. The first target IC chip temperature range is different from the second target IC chip temperature range.

In some implementations, the method includes: in a first phase of operation, jointly determining a common power supply voltage for both of the first power rail and the second power rail; and, in a second phase of operation following the first phase of operation, independently determining the first power supply voltage and the second power supply voltage to be different from one another.

In some implementations, the method includes determining the first power supply voltage subject to a first target power range for the first plurality of IC chips, and determining the second power supply voltage subject to a second target power range for the second plurality of IC chips. The first target power range is different from the second target power range.

DETAILED DESCRIPTION

This disclosure relates to differentiated, independent power control for multiple integrated circuit (IC) chips on a common circuit board (e.g., a printed circuit board (PCB)). In some implementations, a circuit board includes multiple IC chips that are configured to perform computations, e.g., cryptographic hash operations and/or Large Language Model (LLM) operations, among others. The multiple IC chips may be structurally identical or substantially identical to one another and configured to perform their respective computations in parallel.

In some implementations, rather than drawing power from a single, common power rail, different IC chips on the circuit board draw power from different power rails. For example, a first set of the IC chips can draw power from a first power rail, and a second set of the IC chips can draw power from a second power rail. Respective voltages of the different power rails can be set to be different from one another, e.g., determined independently based on different input data and/or using different determination criteria/goals. As such, power control can account for the different parameters and different target operating conditions of different sets of IC chips, permitting more efficient, effective circuit operation.

Figure 1:
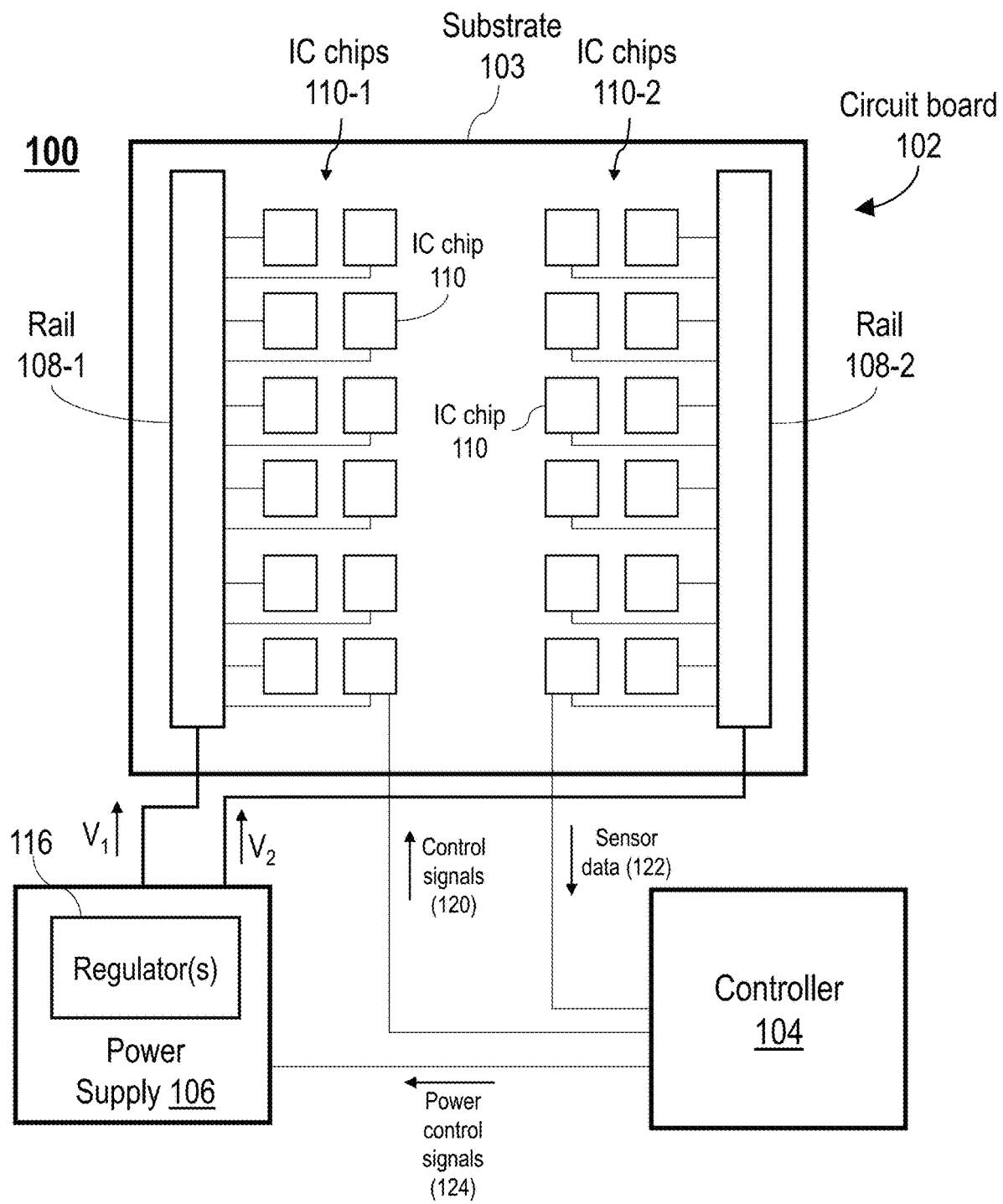
FIG. 1 is a diagram illustrating an example of a circuit system for power control of IC chips.

FIG. 1 illustrates an example of a circuit system 100 for power control of IC chips, according to some implementations of the present disclosure. The circuit system 100 includes a circuit board 102, a controller 104, and a power supply 106.

The circuit board 102 includes multiple IC chips 110 on a common substrate 103. The substrate 103 can be, for example, a semiconductor substrate, a dielectric substrate, or a printed circuit board (PCB). The multiple IC chips 110 can be mounted on a common surface of the substrate 103. For example, the IC chips 110 can be mounted on the substrate 103 using a through-hole, surface-mount, or ball-grid array (BGA) mount that electrically couples the IC chips 110 to conductive (e.g., metal) interconnections on and/or in the substrate 103. The substrate 103 can be substantially planar, and the multiple IC chips 110 can be mounted in a common manner on the substantially planar substrate 103, e.g., using a same mounting method on a same mounting surface of an integral portion of the substrate 103.

In the example of FIG. 1, the IC chips 110 are application-specific integrated circuits (ASICs), but the IC chips 110 can be of any one or more suitable types in various implementations, such as general-purpose processor chips, field-programmable gate array (FPGA) chips, etc. An example of an IC chip 110 is described in more detail with respect to FIG. 5.

The IC chips 110 receive power from power rails 108. In some implementations, different sets of IC chips 110 are connected to and receive power (e.g., a supply voltage) from different power rails 108. For example, as shown in FIG. 1, a first set 110-1 of IC chips 110 receives a voltage $V_1$ from a first power rail 108-1, and a second set 110-2 of IC chips 110 receives a voltage $V_2$ from a second power rail 108-2. $V_1$ and $V_2$ can be jointly or independently determined and can be the same or different from one another. As discussed in further detail below, in some implementations the circuit system 100 is configured to independently determine $V_1$ and $V_2$ (e.g., so as to make $V_1$ and $V_2$ different from one another).

The sets 110-1, 110-2 of IC chips can, but need not, be spatially separated from one another. For example, in the circuit board 102, the first set 110-1 is arranged on a first lateral side of the circuit board 102, and the second set 110-2 is arranged on a second lateral side of the circuit board 102, opposite the first side. In some implementations, the sets 110-1, 110-2 are spaced apart from one another, as shown in FIG. 1. However, in some implementations, sets of IC chips connected to different power rails are not spatially separated but, rather, can be intermingled with one another.

Various form-factors and configurations for the power rails 108 are within the scope of this disclosure. The power rails 108 can include, for example, metal traces, large-area metal contacts (e.g., ground planes), buses, busbars, and/or conductive mounts/standoffs between the power supply 106 and the circuit board 102. Further, in some implementations each power rail 108 includes two portions (for example, terminals, sections of conductive material, and/or the like) that together define the voltage provided by the rail. For example, each power rail 108 can include a grounded portion (e.g., a ground terminal) and a portion set to the controllable voltage (e.g., a voltage terminal).

The voltages received at the IC chips 110 from the rails 108 are power supply voltages. For example, the voltages can be DC or substantially DC voltages. The voltages received from the rails 108 can be distinguished from logic signals, command signals, other power supply voltages, and other information-carrying signals that the IC chips 110 may exchange with other component(s) of the circuit system 100 and/or with one another. The voltages $V_1$ and $V_2$ serve a same purpose and function for the respective IC chips 110 receiving the voltages $V_1$ and $V_2$. For example, the voltages $V_1$ and $V_2$ can be received at a same terminal of respective IC chips 110 to which the voltages $V_1$ and $V_2$ are provided, and can be routed to same component(s) of their respective IC chips 110. The voltages $V_1$ and $V_2$ can be equivalents of one another (e.g., in connection, function, and/or the like) except for providing power to different sets of IC chips 110.

In some implementations, a higher supply voltage is associated with a higher clock frequency, higher power consumption, higher necessary heat dissipation, and higher hash rate, and a lower supply voltage is associated with a lower clock frequency, lower power consumption, lower necessary heat dissipation, and lower hash rate. In some implementations, supply voltage and clock frequency are correlated. E.g., when supply voltage is increased, the clock frequency is also increased, and, when supply voltage is decreased, the clock frequency is also decreased. The supply voltage and clock frequency may be adjusted separately from one another, e.g., without a causal relationship. Adjusting frequency in concert with supply voltage can maintain acceptable failure rates and provide optimized throughput efficiency (e.g., J/TH (Joules per Terahash)).

In the example of FIG. 1, each IC chip 110 has an independent electrical connection (e.g., through one or more metal interconnects and/or vias) to its corresponding power rail 108. However, other power distribution configurations are also within the scope of this disclosure. For example, the IC chips 110 within each set 110-1, 110-2 can be daisy-chained with one another to distribute $V_1$ or $V_2$ throughout each set 110-1, 110-2, or the IC chips 110 within each set 110-1, 110-2 can be connected in series such that IC chips 110 receive power supply voltages provided from a prior IC chip 110 and stepped-down by the prior IC chip 110. For example, the IC chips 110 within each set 110-1, 110-2, can be connected such that the ground voltage of one IC chip 110 is the power supply voltage of a next IC chip 110 in the set 110-1, 110-2.

The voltages $V_1$ and $V_2$ are supplied to the power rails 108 by a power supply 106. The power supply 106 can be a single power supply unit or can include two or more distinct power supply modules or devices, e.g., in separate enclosures. In some implementations, the power supply 106 includes one or more circuit boards, for example, one or more circuit boards and associated other components (e.g., wiring, cooling unit(s), and the like) constituting a power supply unit (PSU). The power supply 106 can be connected to the power rails 108 by one or more conductive elements, such as wiring, conductive mounts/standoffs, cables, and/or the like.

In some implementations, the power supply 106 is configured to receive an input voltage and to convert the input voltage into the output voltages $V_1$ and $V_2$. For example, the power supply 106 can be configured to receive, as an input voltage, single-phase AC 208-277Vac, three-phase AC 370/415/480Vac, and/or 400V DC, and to convert this input into a lower-voltage output. For example, voltages applied to individual IC chips 110 can be DC voltages with magnitude between 200 mV and 2 V, e.g., less than 5 V. In implementations including parallel power supply as in FIG. 1, or other configurations in which $V_1$ and $V_2$ are applied directly into multiple IC chips 110, this voltage range can be the voltage range of $V_1$ and $V_2$. In some implementations including series power supply, $V_1$ and $V_2$ are sufficiently high to provide progressively stepped-down voltages to an entire set 110-1, 110-2 of IC chips 110. For example, $V_1$ and $V_2$ can be in a range from 11V to 47V, and (in the case of 11V), a first IC chip 110 can receive 11V and output, as its ground voltage, 9.8V, a second IC chip 110 can receive the 9.8V and output, as its ground voltage, 8.6V, etc. However, other voltage magnitudes for $V_1$ and $V_2$ are also within the scope of this disclosure. One or more regulators or rectifiers included in the power supply 106 can be configured to perform the foregoing conversion.

The power supply 106 is configured to receive power control signals 124 that set the output voltages $V_1$ and $V_2$. For example, the power supply 106 can be configured to receive the power control signals 124 and process them, for example, using a predetermined correspondence between the power control signals 124 and the values of the output voltages $V_1$ and $V_2$.

In some implementations, the power supply 106 includes one or more adjustable DC-DC regulators 116 configured to generate/output the output voltages $V_1$ and $V_2$. The DC-DC regulators 116 can adjust $V_1$ and $V_2$ based on the power control signals 124. In some implementations, a single DC-DC regulator 116 can provide respective voltages for multiple power rails 108, e.g., can provide both $V_1$ and $V_2$. In some implementations, each DC-DC regulator 116 provides a voltage to a single corresponding power rail 108.

The controller 104 can be a power controller. To perform power control, the controller 104 can provide commands (e.g., send the power control signals 124) to the power supply 106, e.g., commands that indicate voltage(s) to be applied or supplied by the power supply 106 to the rails 108 of the circuit board 102. The power control signals 124 can be any suitable signal type, e.g., analog or digital.

In some implementations, the controller 104 is configured to control one or more aspects of operation of the circuit system 100 other than power. For example, the controller 104 can provide commands to the IC chips 110 (e.g., by sending control signals 120 to the IC chips 110), adjust clock frequencies of the IC chips 110, and/or control any other aspect of the circuit system 100. The controller 104 can be configured to receive sensor data 122 from the circuit board 102, e.g., from individual IC chips 110.

The controller 104 can include a computing device, for example, including one or more processors, one or more memories, one or more storage devices, and one or more interfaces suitable for sending and receiving data as illustrated in FIG. 1. For example, the controller 104 can include one or more circuit boards distinct from the circuit board 102 and board(s) of the power supply 106. In some implementations, the controller 104 is at least partially integrated with the power supply 106 and/or the circuit board 102, e.g., shares at least one common component and/or is at least partially co-located on/in a common circuit board.

Although the controller 104 is shown as both providing input signals and receiving an output 118, in some implementations, separate elements (e.g., separate computing devices) can provide inputs to and receive outputs from the IC chips 110 and/or power supply 106.

As an example of a configuration of the circuit system 100, in some implementations, the circuit system 100 is configured to perform cryptographic operations, e.g., a blockchain mining process, using the IC chips 110. In such cases, the circuit system 100 can be deployed for applications that rely on high-performance computing operations such as blockchain operations, e.g., for cryptocurrency mining, maintaining linked records of digital transactions, etc. In this context, a blockchain is a decentralized and distributed digital ledger that records units of information, e.g., transactions, across multiple computers or nodes. In a blockchain, transactions are grouped into blocks and added to a chain of previous block, forming a chronological sequence. Each block includes a unique identifier, e.g., hash value, and a reference to the previous block, creating a linked structure. The blocks in the same blockchain are linked by having their hash values inserted into a designated field, e.g., a block header, in the next sequential block in the blockchain. A process of blockchain mining is designed to allow a blockchain system to reach a consensus in which all computation nodes in the blockchain system agree to a same blockchain. An example mining process by a computation node of a blockchain system can include computing a valid proof-of-work for a block candidate that will be added to a blockchain. The proof-of-work for a block can include a nonce value that, when inserted into a designated field of the block, makes the cryptographic hash value of the block meets, e.g., equal to or less than, a certain difficulty target set by the system.

In some implementations, the circuit system 100 is configured to perform Large Language Model (LLM) computations, or other machine learning computations, using the IC chips 110. The computations performed by the IC chips 110 are not limited to mining or hashing, but, rather, can be other computation types in some implementations. References in this disclosure to "hash rate" can equally apply to "computation rate," where the computation can be any suitable computation, including (but not limited to) LLM or other machine learning training and/or inference computations.

In some implementations, the IC chips 110 can be configured or customized to perform computations instructed by the controller 104. For example, the IC chips 110 can receive control signals 120 from the controller 104 instructing the IC chips 110 to perform computations for a particular task. After receiving the control signals 120, each of the IC chips 110 can perform the computations indicated/commanded by the control signals 120 and transmit corresponding output signals, e.g., to the controller 104 or to event detector logic. The output signals can indicate/include results of the computations.

Figure 5:
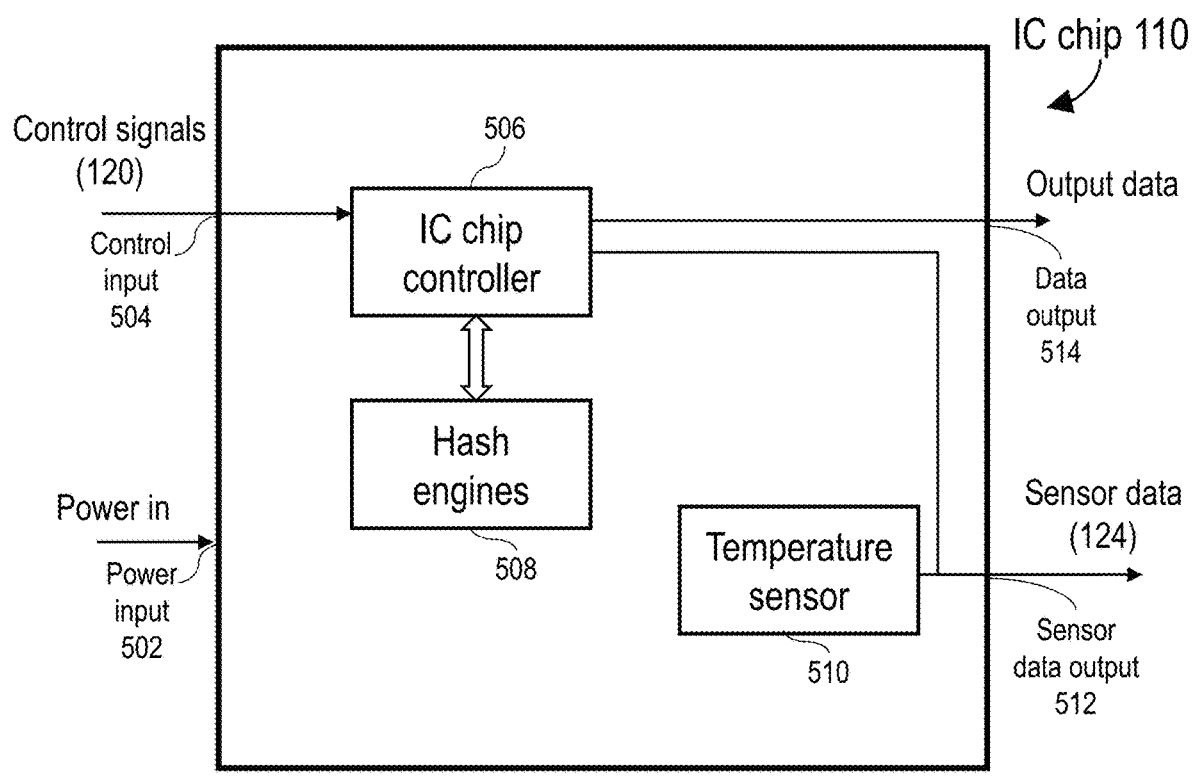
FIG. 5 is a diagram illustrating an example of an IC chip.

FIG. 5 illustrates an example of an IC chip 110. Although several elements of the IC chip 110 are shown in FIG. 5, the IC chip 110 can optionally include additional elements (e.g., internal modules, internal and/or external connections/interconnections), etc.) without departing from the scope of this disclosure.

The IC chip 110 includes a power input 502 for receiving power (e.g., a DC voltage) from a power rail and a control input 504 for receiving control signals 120, e.g., from controller 104. The power received at the power input 502 can be distributed to internal components of the IC chip 110 by internal wiring.

The IC chip 110 further includes an IC chip controller 506 and one or more hash engines 508. The IC chip controller 506 is configured to manage and coordinate operations of various components within the IC chip 110. The IC chip controller 506 can be configured to serve as an interface between the hash engines 508 and other circuits or components of the IC chip 110 and/or external components. For example, the IC chip controller 506 can be configured to receive a control signal 120 from the control input 504, and to transmit a corresponding control signal to the hash engines 508. For example, after receiving a control signal 120 from the controller 104, the IC chip controller 506 can instruct the hash engines 508 to perform cryptographic hash computations. In some implementations, the IC chip controller 506 is communicatively coupled to the hash engines 508, and can obtain computation results from the hash engines 508. The IC chip controller 506 can transmit the computation results and/or values derived therefrom (e.g., signals indicating obtained nonce values) via a data output 514, e.g., to the controller 104. In some implementations, the IC chip controller 506 sets a clock frequency of the IC chip 110 based on the control signals 120. Other methods of setting/adjusting the clock frequency are also within the scope of this disclosure.

In some implementations, each of the one or more hash engines 508 includes hardware components configured to perform cryptographic hash computations. In some implementations, the hash engines 508 can perform the cryptographic hash computations using hash function algorithms such as SHA-1, SHA-256, or MD5, etc.

In some implementations, the IC chip 110 includes one or more circuits specialized for LLM calculations, e.g., instead of or in addition to the one or more hash engines 508.

In some implementations, the IC chip 110 includes a temperature sensor 510. The temperature sensor 510 can output sensor data indicative of an internal temperature of the IC chip 110. The temperature sensor 510 can be any suitable type of temperature sensor, e.g., a resistive sensor or a diode-based temperature sensor. The sensor data can be included in the sensor data 122 that is output, at a sensor data output 512, to the controller 104. In some implementations, the sensor data 122 can include additional or alternative data indicative of internal operation of the IC chip 110. For example, the sensor data 122 can indicate a power consumption of the IC chip 110, a hash rate of the IC chip 110, and/or a clock frequency of the IC chip 110.

The inputs/outputs 502, 504, 512, 514 can be nodes, pins, bumps, and/or the like.

Figure 2:
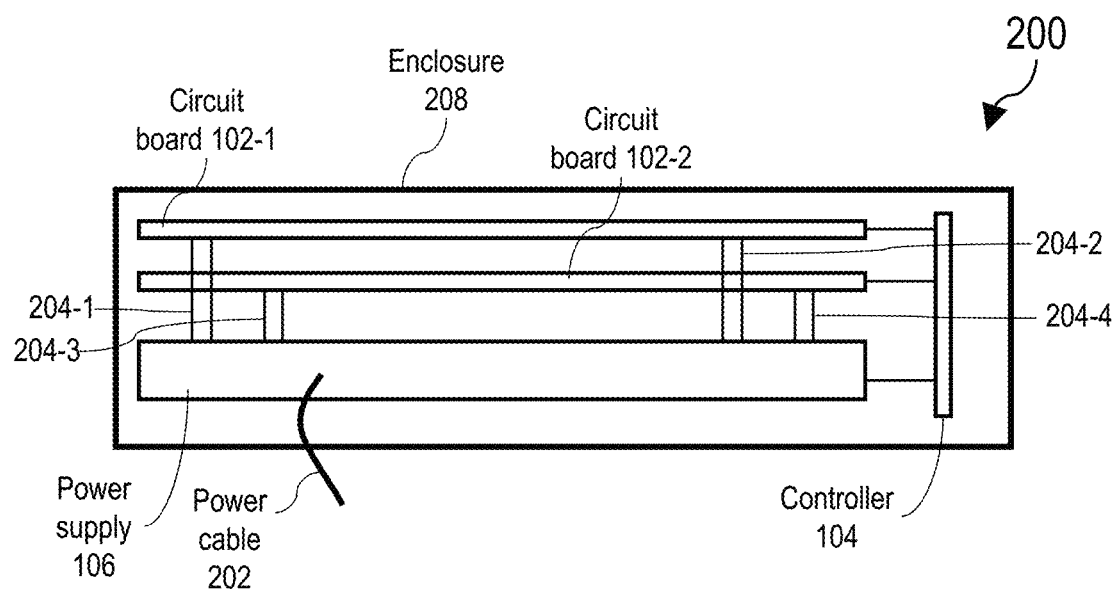
FIG. 2 is a schematic side view of an example of a circuit system for power control of IC chips.

FIG. 2 illustrates an example of a physical configuration of a circuit system for power control of IC chips. The circuit system 200 is similar to the circuit system 100 of FIG. 1, and can have characteristics as described for the circuit system 100 except where noted otherwise or suggested otherwise by context. Unlike the circuit system 100 of FIG. 1, the circuit system 200 includes two circuit boards 102-1, 102-2. Each circuit board 102-1, 102-2 is configured as described for the circuit board 102 and includes multiple IC chips 110 that correspond to at least two power rails included in each circuit board 102-1, 102-2.

Conductive standoffs 204-1, 204-2, 204-3, 204-4 (referred to collectively as conductive standoffs 204) mount the circuit boards 102-1, 102-2 on a power supply 106, which in this example has a circuit board form-factor. The conductive standoffs 204 are configured to carry respective voltages provided by the power supply 106 and provide the respective voltages to respective power rails (two power rails on each circuit board 102-1, 102-2). For example, the respective voltages can be independently-determined, such that the four power rails of the two circuit boards 102-1, 102-2 receive independently-determined voltages. Other configurations are also within the scope of this configuration. For example, in some implementations, standoffs 204-1 and 204-3 transmit a common power supply voltage, and standoffs 204-2 and 204-4 transmit a common power supply voltage. In that case, the respective power supply voltages of each circuit board 102-1, 102-2 are separately-determined, and pairs of power supply voltages between the circuit boards 102-1, 102-2 are jointly determined.

The power supply 106 receives an input voltage (e.g., a three phase AC voltage) over a power cable 202.

In this example, the controller 104 has a form factor of a vertically-mounted circuit board with connections (e.g., wires/cables) to each of the circuit boards 102-1, 102-2 and the power supply 106.

The four circuit boards of the circuit system 200—the circuit boards 102-1, 102-2, the power supply 106, and the controller 104—are mounted in a common enclosure 208. For example, the enclosure 208 can be rack-mountable enclosure. In some implementations, during operation, the enclosure 208 or a portion thereof is immersed in a cooling fluid.

Figure 3:
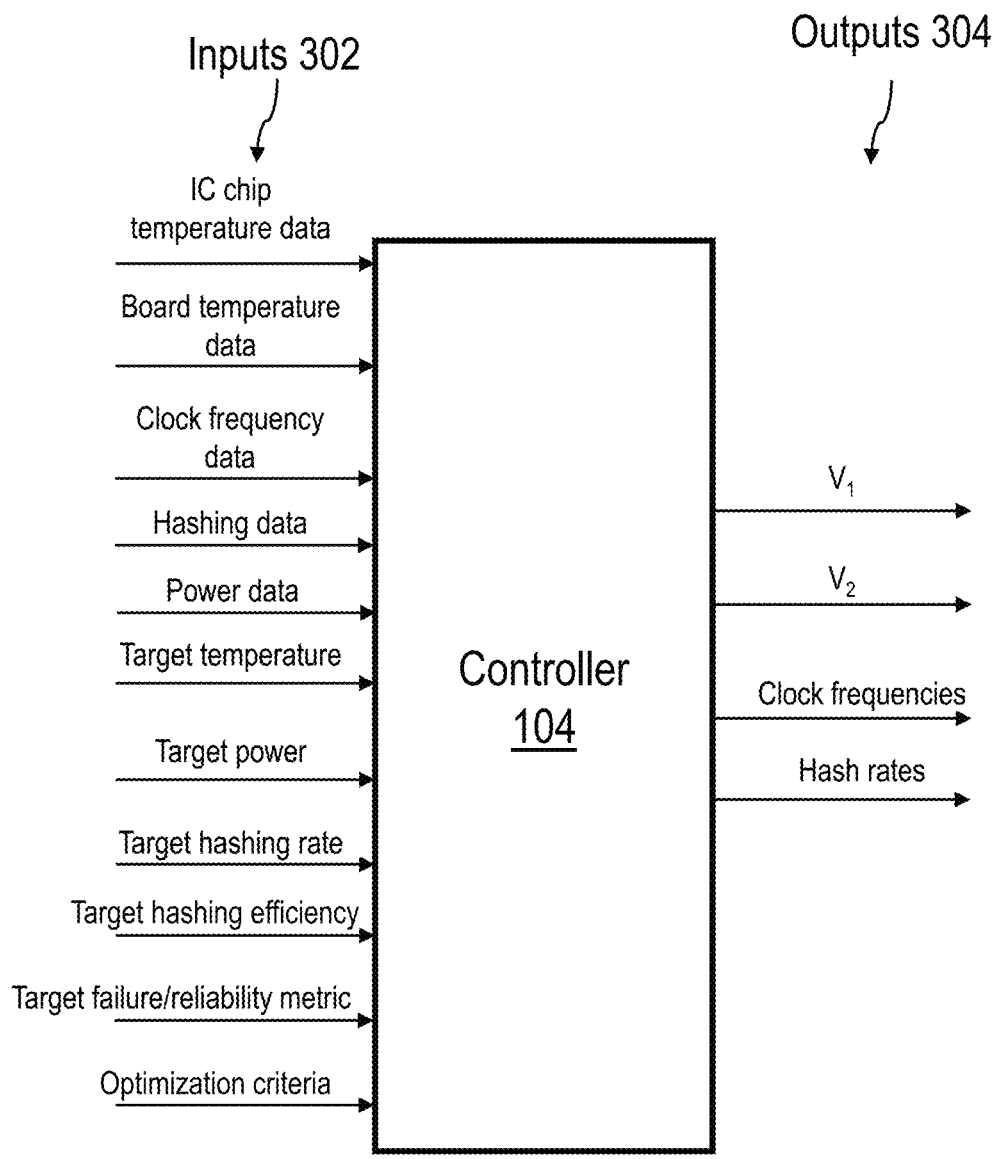
FIG. 3 is a diagram illustrating examples of determination inputs and outputs to a controller of IC chips.

Referring to FIG. 3, according to some implementations of the present disclosure, the controller 104 is configured to receive various inputs 302 and, based on the inputs 302, determine outputs 304 that include two or more voltages for different power rails of a common circuit board, for power control of IC chips. Hereafter, examples are discussed in which two voltages $V_1$ and $V_2$ are determined, e.g., as in the example of FIG. 1. It will be understood, however, that in some implementations a single circuit board can have more than two power rails with independently-determined voltages, and/or a controller 104 can be configured to independently determine voltages for power rails of two or more circuit boards, each of which can have one or more power rails.

The controller 104 executes a decision process to independently determine $V_1$ and $V_2$. For example, $V_1$ and $V_2$ can be independently determined based on input data that separately characterizes the sets 110-1, 110-2 of IC chips served respectively by the power rails 108-1, 108-2 that respectively receive $V_1$ and $V_2$. As such, $V_1$ and $V_2$ can be determined in a differentiated, customized manner that accounts for potentially-different conditions, targets, operation conditions, etc., for the two sets 110-1, 110-2, so as to achieve overall more-optimal, more-efficient operation.

For example, in some cases, efficient and/or stable/non-damaging operation of the IC chips 110 is achieved when the IC chips 110 operate within a specific power supply voltage range. However, first, that range might be different for different ones (or sets) of the IC chips 110. For example, based on their past usage (e.g., thermal and/or operation history), manufacturing variation, and/or different physical positions, each IC chip 110 or set of IC chips 110 may exhibit efficient and/or stable operation in a different power supply voltage range. For example, IC chips 110 arranged in different positions on the circuit board 102 (e.g., spatially-separated sets of IC chips 110) might be exposed to different levels of cooling fluid flow or heat transfer, different cooling fluid temperatures, different contributors to localized heating from other IC chips 110, etc., such that their target power supply voltage range is different.

"Efficient" operation may mean, for example, performing the highest rate of hash operations without failing or with IC chip failure probability/failure rate below a target threshold, or performing the highest rate of hash operations per unit power consumed, to provide two non-exhaustive examples.

In addition, different ones (or sets) of the IC chips 110 may be associated with different operational objectives. For example, a first set of IC chips 110 may have the objective of performing as many hash operations as possible without failing; a second set of IC chips 110 may have the objective of performing as many hash operations as possible while maintaining power consumption below a maximum value; and a third set of IC chips 110 may have the objective of performing a number of hash operations and having a power consumption that are based on a financial algorithm incorporating various factors, e.g., power price, cryptocurrency price, and/or the like. Each of these objectives may be better or best achieved with a different power supply voltage.

The ability of the circuit system 100 to determine the voltages $V_1$ and $V_2$ independently, to provide different, independently-determined power supply voltages to different sets of IC chips, can account for these inter-chip differences in characteristics and/or objectives, which can provide improved overall operation.

FIG. 3 illustrates examples of inputs 302 based on which the controller 104 can independently determine the voltages $V_1$ and $V_2$. In some implementations, the inputs 302 include temperature data. For example, the inputs 302 can include IC chip temperature data (e.g., from temperature sensors 510 included in the IC chips 110), which characterizes individual temperatures (e.g., internal temperatures) of the IC chips 110. The inputs 302 can instead or additionally include board temperature data, which characterizes a temperature of a circuit board. For example, the board temperature data can characterize a temperature of the substrate 103, a circuit board of the power supply 106, and/or a temperature of a circuit board of the controller 104. For example, at least some of the board temperature data can be provided by a temperature sensor on or in the substrate 103 and spaced apart from the IC chips 110. The board temperature data can indicate an ambient temperature of the circuit system 100, as compared to the more specific temperatures of the individual IC chips 110. The board temperature data can be received at the controller 104 through a connection (e.g., wiring) between the circuit board 102 and the controller 104. The temperature data can be received in real-time or near-real-time, e.g., periodically with a short interval between receptions of the temperature data.

As an example of temperature-based operation, in some implementations, the controller 104 is configured to increase a power supply voltage and increase a clock frequency based at least on the IC chips receiving the supply voltage having a temperature characteristic, e.g., having an average temperature below a threshold value or within a specified range. For example, if the first set 110-1 of IC chips 110 have a maximum temperature rating of 90° C. and an average temperature of the first set 110-1 is 85° C., the controller 104 can increase $V_1$ and increase the clock frequency of the first set 110-1 based on the average temperature being less than a threshold value (e.g., 90° C.). This adjustment can be specific to $V_1$. For example, the controller 104 may not adjust $V_2$ or may adjust $V_2$ differently from $V_1$, e.g., based on the average temperature of the first set 110-2 being above the threshold value, based on the maximum temperature rating of the second set 110-2 being different from (e.g., lower than) that of the first set 110-1, and/or based on the second set 110-2 otherwise having different operational targets (e.g., temperature, hashing, or power targets) from the first set 110-1.

As an example of a control process, from an initial $V_1$ and clock frequency $f_1$ for the first set 110-1, the controller 104 can determine that a hit rate (or failure rate) is within a defined acceptable range and that a temperature of the first set 110-1 (e.g., average temperature or maximum individual IC temperature) is within a defined acceptable range. Based on this determination, the controller 104 can increase $V_1$ and $f_1$. If failures increase outside the acceptable range and/or if the temperature shifts to outside the acceptable range, the controller 104 can revert to the initial $V_1$ and $f_1$. If the hit rate (or failure rate) and temperature are still within the acceptable range, the controller 104 can again increase $V_1$ and $f_1$. The controller 104 can repeat this process until the temperature exceeds its acceptable range and/or until the hit rate (or failure rate) is outside its acceptable range. The acceptable ranges for temperature and hit rate (or failure rate) can be set or adjusted based on various objectives such as a performance target, a power consumption target, and/or a reliability target. In some implementations, the step sizes by which $V_1$ and/or $f_1$ are increased can be decreased for subsequent iterations, e.g., to provide fine-tuning. These changes can be independent of changes to $V_2$ and $f_2$, which can be varied differently or not at all during control of $V_1$ and $f_1$.

In some implementations, the controller 104 is configured to receive at least one of hashing data (indicating, e.g., a hash rate of individual IC chips 110), power data (indicating, e.g., power consumption by individual IC chips 110), and/or frequency data (indicating, e.g., clock frequencies of individual IC chips 110). The controller 104 can independently determine $V_1$ and $V_2$ based on one or more of these data types, optionally in combination with the temperature data discussed above. As such, overall improved operation can be achieved.

For example, in some implementations, each IC chip 110 is set to operate in a small target hash rate range. This range can be based on physical characteristics of the circuit system 100 and/or based on optimization criteria (discussed in more detail below). For example, an entity assigned to operate or guide operation of the first set 110-1 may elect to operate the first set 110-1 with a low power consumption limit, such that the first set 110-1 is to be operated in a low hash rate range and with a low power supply voltage. An entity assigned to operate or guide operation of the second set 110-2 may prefer to obtain a high hash rate, in association with a high power supply voltage. It would be inefficient to try to satisfy both of these preferences on the same circuit board 102 with a single power supply voltage, e.g., because they represent conflicting target values for the power supply voltage. However, because the sets 110-1, 110-2 receive independently-determined power supply voltages $V_1$ and $V_2$ that can be different from one another, the preferences of the two entities can be simultaneously satisfied.

For example, the controller 104 can use the received power consumption data and/or clock frequency data of the first set 110-1 to set the power supply voltage $V_1$ of the first set 110-1 to a value such that the power consumption of the first set 110-1 satisfies the desired low power consumption limit. In some implementations, the controller 104 correspondingly adjusts the clock frequency at which the first set 110-1 operates to match, or based on, the determined power supply voltage $V_1$. For example, the controller 104 can decrease $V_1$ and decrease the clock frequency of the first set 110-1.

The controller 104 can used the received hashing data and/or clock frequency data of the second set 110-2 to set a power supply voltage $V_2$ of the second set 110-2 such that the second set 110-2 satisfies the desired high hash rate. In some implementations, the controller 104 correspondingly adjusts the clock frequency at which the second set 110-2 operates to match, or based on, the determined power supply voltage $V_2$. For example, the controller 104 can increase $V_2$ and increase the clock frequency of the second set 110-2. As such, system performance can be improved or maximized while maintaining reliability by accounting for the different environments and/or conditions (e.g., system install orientation, cooling environment, ASIC manufacture difference, etc.) of different sets of IC chips.

As another example, a set of IC chips managed with a higher tolerance for chip failure can be operated at a higher temperature by increasing the power supply voltage of the set and increasing the clock frequency of the set. A set of IC chips managed with a lower tolerance for chip failure can be operated at a lower temperature by decreasing the power supply voltage of the set and decreasing the clock frequency of the set As noted above, the foregoing control and adjustment can be performed, for example, by sending suitable power control signals 124 to the power supply 106 in order to adjust the settings of one or more DC-DC regulators 116 that supply $V_1$ and $V_2$, and in some implementations by sending suitable control signals 120 to set hash rates and/or clock frequencies of the IC chips 110.

In effect, the circuit system 100 has extra degrees of freedom compared to a circuit system in which only a single power supply voltage is determined and received for all of the IC chips 110. A "high-performance" set of IC chips 110 can be controlled to have a higher power supply voltage and clock frequency, and a "low-performance" set of IC chips 110 can be controlled to have a lower power supply voltage and clock frequency. As a result, the entire circuit system 100 can operate more optimally and satisfy multiply objectives simultaneously.

As shown in FIG. 3, the controller 104 can receive optimization criteria. The optimization criteria can guide voltage determination by the controller 104. For example, the optimization criteria can indicate one or more variables or sets of variables to be optimized individually or in combination when determining the power supply voltages. These variables can include, for example, IC chip temperature, hash rate, hash efficiency, power consumption, an IC chip reliability metric or failure metric, and/or the like. The optimization criteria can instead or additionally include one or more constraints on voltage determination by the controller 104, e.g., target ranges, maximum values, and/or minimum values for any of the foregoing parameters and/or other parameters such as clock frequency. The constraints of the optimization criteria can include the target values shown as inputs 302 in FIG. 3.

The controller 104 can use any suitable method or combination of methods to determine the voltages to be supplied to the power rails, e.g., based on the optimization criteria described above. For example, in some implementations, the controller 104 solves a constrained optimization problem based on the optimization criteria. Optimization methods that can be used by the controller 104 can include—but are not limited to gradient methods, randomized search methods, genetic algorithm methods, and stochastic methods. In some implementations, the controller 104 executes one or more trained machine learning models, where the models have been trained to receive, as input, any one or more of the inputs 302 shown in FIG. 3, and to output the power supply voltages (in some cases along with other operational data such as clock frequencies, hash rates, etc., according to which the IC chips 110 are to operate). The machine learning models can include any one or more types of machine learning model, such as neural networks, large language models, etc. However, other training methods and optimization methods are also within the scope of this disclosure.

Based on the above, it will be apparent that different target parameter ranges, optimization objectives, and/or different constraints can apply to different sets of IC chips 110. For example, in some implementations, target temperature ranges, target hashing rate ranges, target hashing efficiency ranges, target failure/reliability metrics, and/or target power consumption ranges for different sets 110-1, 110-2 of IC chips 110 are different. Based on these differences, the controller 104 can independently determine $V_1$ and $V_2$ such that $V_1$ and $V_2$ are different from one another.

As shown in FIG. 3, one or more of the target ranges and/or the optimization criteria can be received at the controller 104, for example, from another device or computer system. For example, the one or more target ranges and/or the optimization criteria can be received at the controller 104 from a computer system that manages multiple circuit systems like the circuit system 100. The target ranges and/or the optimization criteria can be set by one or more users and/or entities that control operation of the circuit system 100.

In some implementations, one or more of the target ranges is determined by the controller 104 itself, e.g., based on the optimization criteria. For example, given an optimization objective for the set of IC chips (e.g., a variable to be optimized and a maximum-power constraint), the controller can determine a target temperature range and/or target hash rate range for the set of IC chips and adjust the power supply voltage for the set of IC chips based on the determined target temperature range and/or target hash rate range.

In some implementations, control by the controller 104 is in real-time or near-real time, e.g., periodically with a short interval between iterations. In each iteration, the controller 104 can determine the outputs 304 and provide appropriate signals (e.g., signals 120 and/or 124) to control operation of the circuit system 100. As noted above, the determination can be based on sensor data obtained in real-time or near-real time. As such, the controller 104 can respond dynamically based on real-time temperature and performance requirements/conditions to achieve improved performance based on differentiated voltage generation.

In some implementations, the power supply voltages (e.g., $V_1$ and $V_2$) are determined "independently" at least in that the controller 104 determines the power supply voltages based on at least partially different information and/or using different optimization criteria. In some implementations, the power supply voltages are determined "independently" in that the controller 104 executes respective independent software threads for calculation of the power supply voltages. For example, the software threads can be executed in parallel. In some implementations, the power supply voltages are determined "independently" in that the process by which the power supply voltages are determined permits $V_1$ and $V_2$ to be different from one another and/or to be adjusted independently of one another.

Figure 4:
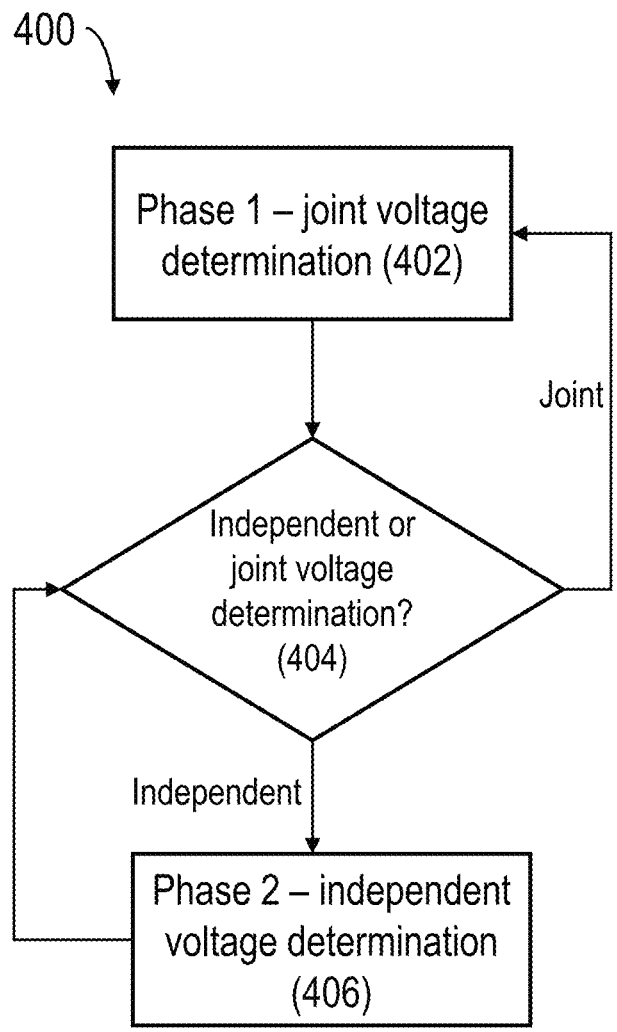
FIG. 4 is a diagram illustrating an example of a decision process for power control of IC chips.

In some implementations, the controller 104 is configured to operate in two distinct phases/modes corresponding to independent voltage determination and joint voltage determination, respectively. For example, as shown in FIG. 4, in some implementations, the controller 104 is configured to execute a process 400 for power control of IC chips. In Phase 1 (402), the controller 104 determines $V_1$ and $V_2$ jointly as a common value $V=V_1=V_2$. V is supplied to both power rails 108-1, 108-2. For example, the controller 104 can execute a single software thread to determine the common value V and/or can determine V for both power rails 108-1, 108-2 using the same data and same optimization criteria to derive the same resulting voltage. In some implementations, in Phase 1, the power supply voltage for all equivalent power rails on the circuit board is determined.

Periodically and/or in response to a condition being satisfied, the controller 104 determines whether to perform independent or joint voltage determination (404). The controller 104 can make the determination, for example, based on a degree of difference in operation conditions and/or optimization criteria between the two sets 110-1, 110-2 of IC chips 110. For example, in some implementations, the controller 104 makes the determination based on a degree of temperature difference between the two sets 110-1, 110-2, e.g., a difference in the average temperatures thereof as determined based on the temperature sensors 510 included in each IC chip 110. If the temperature difference satisfies a condition (e.g., is greater than a threshold value), the controller 104 can switch to Phase 2 (406), in which the power supply voltages are determined independently. Otherwise, the controller 104 can remain in Phase 1 (402). As another example, if the optimization criteria and/or target parameter range(s) for the sets 110-1, 110-2 are sufficiently different, the controller 104 can switch to Phase 2 (406); otherwise, the controller 104 can remain in Phase 1 (402). Phase 2 operation corresponds to the independent voltage determination described throughout this disclosure. In some implementations, from Phase 2 (406), the controller 104 can optionally determine (e.g., periodically and/or in response to a condition being satisfied) whether to perform independent or joint voltage determination (404).

In some cases, if the sets 110-1, 110-2 are generally operating under similar conditions (e.g., are at similar temperatures) and with similar optimization criteria (e.g., similar constraints/objectives with respect to power, hash rate, temperature, etc.) it may be preferable to determine the power supply voltages jointly, e.g., to avoid potential increased latency, computational resource consumption, and/or heat dissipation, since in that situation the performance/efficiency benefits of independent determination may be relatively low. In that case, Phase 1 operation can be beneficial. By contrast, when the operation conditions and/or optimization criteria are sufficiently different from one another, the gains offered by independent determination may outweigh the increased computational cost, and the controller 104 can operate in Phase 2.

It will be understood, therefore, that the division of IC chips 110 into multiple sets can be based on intrinsic characteristics of the IC chips 110 (e.g., absolute or relative locations) and/or based on different dynamic conditions and/or different dynamic optimization criteria of the IC chips 110. As such, the IC chips 110 can be divided into different sets at different times, for example, based on the different conditions and optimization criteria of the IC chips.

In some implementations, three or more power rails providing equivalent voltages (e.g., voltages provided to the same inputs of IC chips and used for the same purpose) are present, and the three or more power rails are grouped into two or more groups. The controller 104 can determine a power supply voltage for power rails within each group jointly, and can determine power supply voltages for different groups separately. In some implementations, this control is performed continuously. In some implementations, this control is performed during at least one phase of operation. For example, the phase can correspond to Phase 2 of FIG. 4 or can be another phase distinct from Phase 2. For example, in some implementations, phases include a first phase in which a same power supply voltage is determined for all power rails jointly; a second phase in which a same power supply voltage is determined jointly within groups, and different power supply voltages are determined independently between groups; and a third phase in which different power supply voltages are determined independently for each power rail.

Some implementations of the subject matter and operations described in this specification can be implemented in digital electronic circuitry, or in computer software, firmware, or hardware, including the structures disclosed in this specification and their structural equivalents, or in combinations of one or more of them. For example, in some implementations, the controller 104, the IC chip controller 506, and/or the hash engines 508 can be implemented using digital electronic circuitry, or in computer software, firmware, or hardware, or in combinations of one or more of them. As another example, the voltage determination process described with respect to FIG. 3 can be implemented using digital electronic circuitry, or in computer software, firmware, or hardware, or in combinations of one or more of them.

Some implementations described in this specification (e.g., voltage determination processes, decision processes, optimizations, machine learning execution, etc.) can be implemented as one or more computer programs, that is, one or more modules of computer program instructions, encoded on computer storage medium for execution by, or to control the operation of, data processing apparatus. A computer storage medium can be, or can be included in, a computer-readable storage device, a computer-readable storage substrate, a random or serial access memory array or device, or a combination of one or more of them. Moreover, while a computer storage medium is not a propagated signal, a computer storage medium can be a source or destination of computer program instructions encoded in an artificially generated propagated signal. The computer storage medium can also be, or be included in, one or more separate physical components or media (for example, multiple CDs, disks, or other storage devices).

The term "data processing apparatus" encompasses all kinds of apparatuses, devices, and machines for processing data, including by way of example a programmable processor, a computer, a system on a chip, or multiple ones, or combinations, of the foregoing. The apparatus can include special purpose logic circuitry, for example, an FPGA (field programmable gate array) or an ASIC (application specific integrated circuit). The apparatus can also include, in addition to hardware, code that creates an execution environment for the computer program in question, for example, code that constitutes processor firmware, a protocol stack, a database management system, an operating system, a cross-platform runtime environment, a virtual machine, or a combination of one or more of them. The apparatus and execution environment can realize various different computing model infrastructures, such as web services, distributed computing and grid computing infrastructures.

A computer program (also known as a program, software, software application, script, or code) can be written in any form of programming language, including compiled or interpreted languages, declarative or procedural languages. A computer program may, but need not, correspond to a file in a file system. A program can be stored in a portion of a file that holds other programs or data (for example, one or more scripts stored in a markup language document), in a single file dedicated to the program in question, or in multiple coordinated files (for example, files that store one or more modules, sub programs, or portions of code). A computer program can be deployed to be executed on one computer or on multiple computers that are located at one site or distributed across multiple sites and interconnected by a communication network.

Some of the processes and logic flows described in this specification can be performed by one or more programmable processors executing one or more computer programs to perform actions by operating on input data and generating output. The processes and logic flows can also be performed by, and apparatus can also be implemented as, special purpose logic circuitry, for example, an FPGA (field programmable gate array) or an ASIC (application specific integrated circuit).

Processors suitable for the execution of a computer program include, by way of example, both general and special purpose microprocessors, and processors of any kind of digital computer. Generally, a processor will receive instructions and data from a read only memory or a random access memory or both. A computer includes a processor for performing actions in accordance with instructions and one or more memory devices for storing instructions and data. A computer can also include, or be operatively coupled to receive data from or transfer data to, or both, one or more mass storage devices for storing data, for example, magnetic, magneto optical disks, or optical disks. However, a computer need not have such devices. Devices suitable for storing computer program instructions and data include all forms of non-volatile memory, media and memory devices, including by way of example semiconductor memory devices (for example, EPROM, EEPROM, AND flash memory devices), magnetic disks (for example, internal hard disks, and removable disks), magneto optical disks, and CD-ROM and DVD-ROM disks. The processor and the memory can be supplemented by, or incorporated in, special purpose logic circuitry.

To provide for interaction with a user, operations can be implemented on a computer having a display device (for example, a monitor, or another type of display device) for displaying information to the user. The computer can also include a keyboard and a pointing device (for example, a mouse, a trackball, a tablet, a touch sensitive screen, or another type of pointing device) by which the user can provide input to the computer. Other kinds of devices can be used to provide for interaction with a user as well. For example, feedback provided to the user can be any form of sensory feedback, such as visual feedback, auditory feedback, or tactile feedback. Input from the user can be received in any form, including acoustic, speech, or tactile input. In addition, a computer can interact with a user by sending documents to and receiving documents from a device that is used by the user. For example, a computer can send webpages to a web browser on a user's client device in response to requests received from the web browser.

A computer system can include a single computing device, or multiple computers that operate in proximity or generally remote from each other and typically interact through a communication network. Examples of communication networks include a local area network ("LAN") and a wide area network ("WAN"), an inter-network (for example, the Internet), a network including a satellite link, and peer-to-peer networks (for example, ad hoc peer-to-peer networks). A relationship of client and server can arise by virtue of computer programs running on the respective computers and having a client-server relationship to each other.

Figure 6:
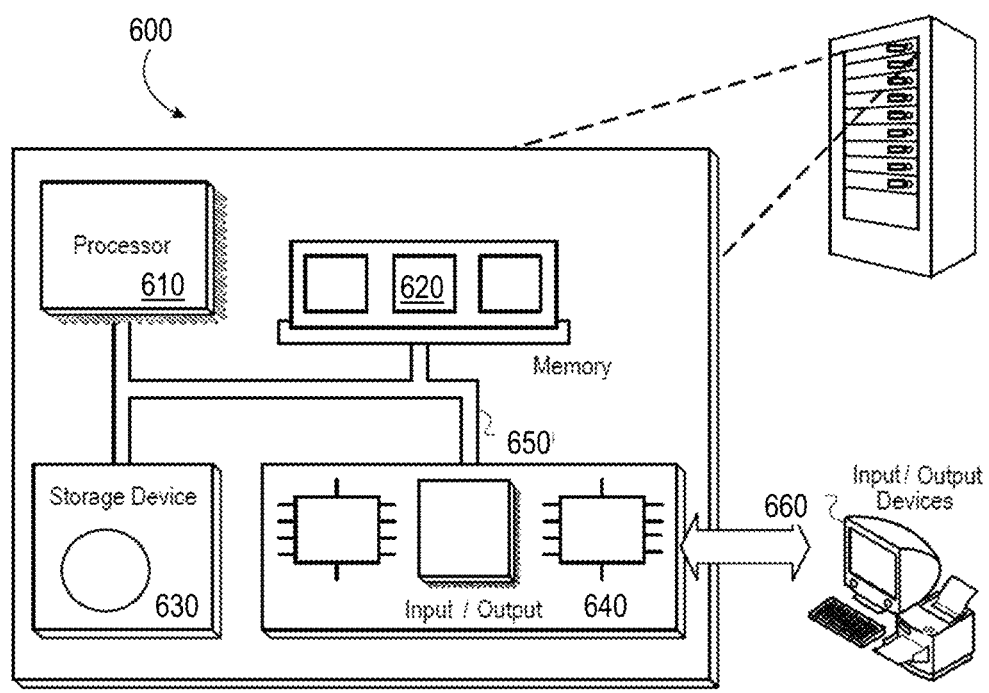
FIG. 6 is a diagram illustrating an example of a computer system.

FIG. 6 illustrates an example of a computer system 600 that includes a processor 610, a memory 620, a storage device 630 and an input/output device 640. Each of the components 610, 620, 630 and 640 can be interconnected, for example, by a system bus 650. The processor 610 is capable of processing instructions for execution within the system 600. In some implementations, the processor 610 is a single-threaded processor, a multi-threaded processor, or another type of processor. The processor 610 is capable of processing instructions stored in the memory 620 or on the storage device 630. In some implementations, the controller 104, the IC chip controller 506, and/or the hash engines 508 can be implemented using the processors 610 and/or using multiple such processors 610, or using the computer system 600 or multiple such computer systems 600. The memory 620 and the storage device 630 can store information within the system 600.

The input/output device 640 provides input/output operations for the system 600. In some implementations, the input/output device 640 can include one or more of a network interface device, for example, an Ethernet card, a serial communication device, for example, an RS-232 port, or a wireless interface device, for example, an 802.11 card, a 3G wireless modem, a 4G wireless modem, or a 5G wireless modem, or both. In some implementations, the input/output device 640 can include driver devices configured to receive input data and send output data to other input/output devices, for example, keyboard, printer and display devices 660. In some implementations, the input/output device 640 can include device interconnections such as cabling, wiring, signal-carrying standoffs, bump bonds, and/or the like. In some implementations, mobile computing devices, mobile communication devices, and other devices can be used.

While this specification contains many details, these should not be construed as limitations on the scope of what may be claimed, but rather as descriptions of features specific to particular examples. Certain features that are described in this specification in the context of separate implementations can also be combined. Conversely, various features that are described in the context of a single implementation can also be implemented in multiple embodiments separately or in any suitable sub-combination. A number of embodiments have been described. Nevertheless, various modifications can be made without departing from the spirit and scope of the invention. Accordingly, other embodiments are within the scope of the claims.

What is claimed is:

1. A circuit system, comprising:
   a circuit board comprising:
      a first plurality of integrated circuit (IC) chips,
      a second plurality of IC chips that is distinct from the first plurality of IC chips,
      a first power rail configured to provide power to the first plurality of IC chips, and
      a second power rail configured to provide power to the second plurality of IC chips;
   a controller configured to receive sensor data from the first plurality of IC chips and the second plurality of IC chips and independently determine, based on the sensor data, a first power supply voltage for the first power rail and a second power supply voltage for the second power rail, wherein the first power supply voltage and the second power supply voltage are different from one another; and
   a power supply configured to provide the first power supply voltage to the first power rail and the second power supply voltage to the second power rail.

2. The circuit system of claim 1, wherein the first plurality of IC chips comprise first temperature sensors configured to output temperature data for the first plurality of IC chips,
   wherein the second plurality of IC chips comprise second temperature sensors configured to output temperature data for the second plurality of IC chips, and
   wherein the controller is configured to determine the first power supply voltage and the second power supply voltage respectively based on the temperature data for the first plurality of IC chips and the second plurality of IC chips.

3. The circuit system of claim 2, wherein the controller is configured to determine the first power supply voltage and the second power supply voltage subject to a target temperature range of at least one of the first plurality of IC chips or the second plurality of IC chips.

4. The circuit system of claim 3, wherein the controller is configured to determine the first power supply voltage subject to a first target IC chip temperature range for the first plurality of IC chips and to determine the second power supply voltage subject to a second target IC chip temperature range for the second plurality of IC chips,
   wherein the first target IC chip temperature range is different from the second target IC chip temperature range.

5. The circuit system of claim 1, wherein the controller is configured to execute a first software thread to determine the first power supply voltage and to execute a second software thread to determine the second power supply voltage.

6. The circuit system of claim 1, wherein the controller is configured to determine the first power supply voltage based on at least a first clock frequency of the first plurality of IC chips and to determine the second power supply voltage based on at least a second clock frequency of the second plurality of IC chips,
   wherein the first clock frequency is different from the second clock frequency.

7. The circuit system of claim 1, wherein the controller is configured to determine the first power supply voltage subject to a first target power range for the first plurality of IC chips and to determine the second power supply voltage subject to a second target power range for the second plurality of IC chips,
   wherein the first target power range is different from the second target power range.

8. The circuit system of claim 1, wherein the controller is configured to adjust at least one first clock frequency of the first plurality of IC chips based on the first power supply voltage, and to adjust at least one second clock frequency of the second plurality of IC chips based on the second power supply voltage,
   wherein the at least one first clock frequency is adjusted to be different from the at least one second clock frequency.

9. The circuit system of claim 1, wherein the controller is configured to:
   in a first phase of operation, jointly determine a common power supply voltage for both of the first power rail and the second power rail; and in a second phase of operation following the first phase of operation, independently determine the first power supply voltage and the second power supply voltage to be different from one another.

10. The circuit system of claim 9, wherein the controller is configured to switch from the first phase of operation to the second phase of operation based on a temperature differential between the first plurality of IC chips and the second plurality of IC chips.

11. The circuit system of claim 1, wherein the power supply comprises at least one DC-DC regulator configured to receive commands from the controller and, based on the commands, provide the first power supply voltage and the second power supply voltage.

12. The circuit system of claim 1, wherein the circuit board is a first circuit board, and wherein the circuit system comprises a second circuit board,
wherein the controller is configured to receive sensor data from IC chips of the second circuit board and determine a third power supply voltage for the IC chips of the second circuit board, wherein the third power supply voltage is determined independently from at least one of the first power supply voltage or the second power supply voltage.

13. The circuit system of claim 1, comprising a common enclosure in which the circuit board, the controller, and the power supply are arranged.

14. The circuit system of claim 1, wherein the circuit board comprises:
a third plurality of IC chips that is distinct from the first and second pluralities of IC chips; and
a third power rail configured to provide power to the third plurality of IC chips, and
wherein the controller is configured to determine a third power supply voltage for the third power rail, wherein the third power supply voltage is determined independently from the first and second power supply voltages.

15. The circuit system of claim 1, wherein the circuit board comprises:
a third plurality of IC chips that is distinct from the first and second pluralities of IC chips; and
a third power rail configured to provide power to the third plurality of IC chips, and
wherein the controller is configured to determine a third power supply voltage for the third power rail jointly with determination of the first power supply voltage, wherein the third power supply voltage is the same as the first power supply voltage.

16. A power control method comprising:
receiving sensor data from a first plurality of integrated circuit (IC) chips and a second plurality of IC chips that is distinct from the first plurality of IC chips,
wherein the first and second pluralities of IC chips are mounted on a common substrate, wherein the first plurality of IC chips is configured to receive power from a first power rail, and wherein the second plurality of IC chips is configured to receive power from a second power rail;
independently determining, based on the sensor data, a first power supply voltage for the first power rail and a second power supply voltage for the second power rail, wherein the first power supply voltage and the second power supply voltage are different from one another; and
providing the first power supply voltage to the first power rail and the second power supply voltage to the second power rail.

17. The power control method of claim 16, wherein the first plurality of IC chips comprise first temperature sensors configured to output temperature data for the first plurality of IC chips,
wherein the second plurality of IC chips comprise second temperature sensors configured to output temperature data for the second plurality of IC chips, and
wherein the method comprises determining the first power supply voltage and the second power supply voltage based respectively on temperature data for the first plurality of IC chips and the second plurality of IC chips.

18. The power control method of claim 16, comprising determining the first power supply voltage subject to a first target IC chip temperature range for the first plurality of IC chips, and determining the second power supply voltage subject to a second target IC chip temperature range for the second plurality of IC chips,
wherein the first target IC chip temperature range is different from the second target IC chip temperature range.

19. The power control method of claim 16, comprising:
in a first phase of operation, jointly determining a common power supply voltage for both of the first power rail and the second power rail; and
in a second phase of operation following the first phase of operation, independently determining the first power supply voltage and the second power supply voltage to be different from one another.

20. The power control method of claim 16, comprising determining the first power supply voltage subject to a first target power range for the first plurality of IC chips, and determining the second power supply voltage subject to a second target power range for the second plurality of IC chips,
wherein the first target power range is different from the second target power range.

* * * * *